(12) United States Patent
Tsujimura et al.

(10) Patent No.: US 6,197,435 B1
(45) Date of Patent: Mar. 6, 2001

(54) SUBSTRATE

(75) Inventors: Yoshihiko Tsujimura; Miyuki Nakamura; Yasuhito Fushii, all of Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/175,476

(22) Filed: Oct. 20, 1998

(30) Foreign Application Priority Data

Nov. 7, 1997 (JP) .......................................... 9-30564

(51) Int. Cl.[7] .............................. B32B 15/04; H01L 23/52; B23K 1/00

(52) U.S. Cl. ............................ 428/621; 216/13; 216/100; 228/101; 228/262.1; 228/903; 257/748; 257/750; 257/751; 257/761; 257/762; 257/763; 257/764; 257/765; 257/766; 257/767; 257/768; 257/769; 257/770; 257/771; 428/606; 428/607; 428/627; 428/635; 428/643; 428/644; 428/645; 428/650; 428/651; 428/652; 428/654; 428/655; 428/656; 428/660; 428/661; 428/668; 428/669; 428/671; 428/675; 428/680; 428/433; 428/434; 428/450; 428/901; 428/926; 428/939

(58) Field of Search ..................................... 428/621, 627, 428/606, 607, 635, 643, 644, 645, 650, 651, 652, 654, 655, 656, 660, 661, 668, 669, 671, 675, 680, 926, 433, 434, 450, 901, 939; 257/748, 750, 751, 761, 762–771; 228/101, 262.1, 903; 216/13, 100

(56) References Cited

U.S. PATENT DOCUMENTS 3,607,379 * 9/1971 Leinkram et al. ................... 428/621
4,463,059 * 7/1984 Bhattacharya et al. ............... 428/671
5,354,415 10/1994 Fushii et al. ............................ 216/13
5,561,321 10/1996 Hirano et al. ......................... 257/700

FOREIGN PATENT DOCUMENTS

| 43 15 272 | 11/1994 | (DE) . |
| 295 14 012 U | 12/1995 | (DE) . |
| 0 297 512 | 1/1989 | (EP) . |
| 0 459 283 | 12/1991 | (EP) . |
| 0 798 779 | 10/1997 | (EP) . |
| 2 309 924 | 8/1997 | (GB) . |

OTHER PUBLICATIONS

Patent Abstracts of Japan, vol. 010, No. 016 (E–375), Jan. 22, 1986, JP 60 177634, Sep. 11, 1985.

* cited by examiner

*Primary Examiner*—Deborah Jones
*Assistant Examiner*—Robert R. Koehler
(74) *Attorney, Agent, or Firm*—Oblon, Spivak, McClelland, Maier & Neustadt, P.C.

(57) ABSTRACT

An article comprising a metal circuit and/or a heat-radiating metal plate formed on a ceramic substrate, wherein the metal circuit and/or the heat-radiating metal plate comprise either (1) the following first metal-second metal bonded product, wherein the first metal and the second metal are different, or (2) the following first metal-third metal-second metal bonded product, and wherein in (1) and (2), the first metal is bonded to the ceramic substrate; first metal: a metal selected from the group consisting of aluminum (Al), lead (Pb), platinum (Pt) and an alloy containing at least one of these metal components; second metal: a metal selected from the group consisting of copper (Cu), silver (Ag), gold (Au), aluminum (Al) and an alloy containing at least one of these metal components; and third metal: a metal selected from the group consisting of titanium (Ti), nickel (Ni), zirconium (Zr), molybdenum (Mo), tungsten (W) and an alloy containing at least one of these metal components.

18 Claims, No Drawings

SUBSTRATE

SUBSTRATE

The present invention relates to a substrate, a method for producing the same and a metal bonded product suitable for the substrate.

The substrate of the present invention is obtained by forming a metal circuit and/or a heat-radiating metal plate on a ceramic substrate. A substrate having a metal circuit only or a metal circuit and a heat-radiating metal plate formed is used as a circuit substrate, or a substrate having a heat-radiating metal plate only formed is used as a heat-radiating substrate. In the present invention, an essential difference between a circuit substrate and a heat-radiating substrate resides in simply that the heat-radiating substrate does not have a metal circuit formed, and accordingly the present invention is described by taking a circuit substrate as an example.

Recently, power modules including large-power and high-efficient inverters have been changed in accordance with improvements on industrial apparatuses such as robots, motors and the like, and heat generated from semiconductor elements steadily increases. In order to efficiently radiate this heat, various steps have been conventionally applied to power module boards. Particularly, a ceramic board having a good heat conductivity has been recently developed, and there is a tendency of employing a structure prepared by bonding a metal plate such as a copper plate onto a substrate board, forming a metal circuit and placing a semiconductor element on the metal plate as it is or after treated with nickel-plating. In this case, there is also a structure having a heat-radiating metal plate such as a copper plate formed on the opposite side of a ceramic substrate having a metal circuit.

Such a module has been used for simple machine tools at the first stage, but recently such a module is used for a welder, a driving part of electric railcar, an electric car and the like, which require durability under more severe environmental conditions end further miniaturization. Accordingly, with regard to a ceramic substrate also, a thickness of a metal circuit is increased to raise an electric current density and durability to thermal shock is required to be improved. In order to satisfy these requirements, a research is made for preparing a new ceramic sintered material.

Heretofore, a commonly used circuit substrate has a structure having a copper circuit formed on an alumina substrate or an aluminum nitride substrate, but in order to improve reliability to heat cycle resistance, a structure having an aluminum circuit formed on an aluminum nitride substrate has been developed. However, since aluminum is worse in electric properties such as electric current density than copper, such a circuit substrate is not widely prevalent.

The present invention has been made under the above circumstances, and its object is to provide a highly reliable substrate (a circuit substrate or a heat-radiating substrate) excellent in heat cycle resistance. Another object of the present invention is to provide a process for preparing such a highly reliable substrate at a satisfactory productivity. Further, other object of the present invention is to provide a metal bonded product suitable as a metal circuit and/or a heat-radiating metal plate to be used for such a highly reliable substrate.

Thus, the present invention resides in a substrate, a method for producing the substrate and a metal bonded product, which have the following essential features.

Substrate embodiment 1: A substrate having a metal circuit and/or a heat-radiating metal plate formed on a ceramic substrate, herein the metal circuit and/or the heat-radiating metal plate comprise the following first metal-second metal bonded product (except for a combination of the same kinds of metals of the first metal and the second metal) and/or the following first metal-third metal-second metal bonded product, and the first metal is bonded to the ceramic substrate;

first metal: a metal selected from the group consisting of aluminum (Al), lead (Pb), platinum (Pt) and an alloy containing at least one of these metal components, second metal: a metal selected from the group consisting of copper (Cu), silver (Ag), gold (Au), aluminum (Al) and an alloy containing at least one of these metal components, and third metal: a metal selected from the group consisting of titanium (Ti), nickel (Ni), Zirconium (Zr), molybdenum (Mo), tungsten (W) and an alloy containing at least one of these metal components.

Substrate embodiment 2: The substrate according to Substrate embodiment 1, wherein the first metal is aluminum and the second metal is nickel-coated copper.

Substrate embodiment 3: The substrate according to Substrate embodiment 1, wherein the first metal is bonded to the third metal through an alloy layer (a) containing first metal-third metal-1b Group metal, an alloy layer (b) containing first metal-third metal-4b Group metal and an alloy layer (c) of first metal-third metal.

Substrate embodiment 4: The substrate according to Substrate embodiment 3, wherein the first metal is aluminum, the second metal is copper and the third metal is nickel.

Substrate embodiment 5: The substrate according to Substrate embodiment 3, wherein the 1b Group metal is copper and the 4b Group metal is silicon.

Substrate embodiment 6: The substrate according to Substrate embodiment 4, wherein the 1b Group metal is copper and the 4b Group metal is silicon.

Substrate embodiment 7: The substrate according to Substrate embodiment 1, wherein the substrate is a power module substrate.

Method embodiment 1: A method for preparing substrate of embodiment 1, which comprises bonding a first metal circuit pattern and/or a heat-radiating metal plate pattern to a metal circuit-forming surface and/or a heat-radiating metal plate-forming surface of a ceramic substrate by active metal-soldering method, and further bonding a second metal pattern different from the first metal thereto with or without intervening a third metal therebetween.

Method embodiment 2: A method for preparing substrate embodiment 1, which comprises bonding a solid metal plate of a first metal to a metal circuit-forming surface and/or a heat-radiating metal plate-forming surface of a ceramic substrate by active metal-soldering method, further bonding a solid metal plate of a second metal different from the first metal thereto with or without intervening a third metal therebetween, and then etching to form a metal circuit and/or a heat-radiating metal plate.

Method embodiment 3: The method according to Method embodiment 1, wherein the first metal is aluminum and the second metal is nickel-coated copper.

Method embodiment 4: The method according to Method embodiment 2, wherein the first metal is aluminum and the second metal is nickel-coated copper.

Method embodiment 5: The method according to Method embodiment 1, wherein the substrate is a power module substrate.

Metal bonded product embodiment 1: A metal bonded product obtained by bonding the following first metal to the following third metal through an alloy layer (a) containing first metal-third metal-1Group metal, an alloy layer (b) containing first metal-third metal-4b Group metal and an alloy layer (c) of first metal-third metal;

first metal: a metal selected from the group consisting of aluminum (Al), lead (Pd), platinum (Pt) and an alloy containing at least one of these metal components, and third metal: a metal selected from the group consisting of titanium (Ti), nickel (Ni), Zirconium (Zr), molybdenum (Mo), tungsten (W) and an alloy containing at least one of these metal components.

Metal bonded product embodiment 2: The metal bonded product according to Metal bonded product embodiment 1, wherein the first metal is aluminum and the third metal is nickel.

Metal bonded product embodiment 3: The metal bonded product according to Metal bonded product embodiment 1, wherein the 1b Group metal is copper and the 4b Group metal is silicon.

Metal bonded product embodiment 4: The metal bonded product according to Metal bonded product embodiment 2, wherein the 1b Group metal is copper and the 4b Group metal is silicon.

Metal bonded product embodiment 5: The metal bonded product according to Metal bonded product embodiment 1, wherein the third metal is further bonded to the following second metal;

second metal: a metal selected from the group consisting of copper (Cu), silver (Ag), gold (Au), aluminum (Al) and an alloy containing at least one of these metal components.

Metal bonded product embodiment 6: The metal bonded product according to Metal bonded product embodiment 5, wherein the metal bonded product is used as a metal circuit and/or a heat-radiating metal plate for a power module substrate.

Hereinafter, the present invention is described in more details. Since a high electric current of a high voltage is flown to a metal circuit part of a power module circuit substrate, a copper circuit is mainly used at present. However, there is a problem that a copper circuit is peeled off from a ceramic substrate due to a thermal stress caused by a thermal expansion difference between copper and ceramics since a thermal shock due to heat and the like by switching or environmental changes during using are repeatedly applied.

The thermal stress caused by a thermal expansion difference between copper and ceramics are determined depending on not only a thermal expansion coefficient but also inherent mechanical properties including a tensile strength, a proof stress and the like of a metal. Accordingly, in order to reduce the thermal stress, a metal having a tensile strength and a proof stress lower than copper is used, but up to now, there is not found such a metal having the above mentioned properties and also having electric properties at the same level as copper.

Accordingly, the present inventors have extensively studied, and as a result of the study have found that the above mentioned problems can be solved by reducing a thermal stress due to a thermal expansion difference between a metal and ceramics by selecting aluminum having a lower tensile strength and a lower proof stress as a metal to be bonded to a ceramic substrate and by laminating copper having satisfactory electric properties on the aluminum with intervening nickel between the two metals so as not to cause reaction and diffusion between the aluminum and the copper due to heat during bonding, thereby forming a desirable metal circuit, and the present inventors further studied a method for bonding these metals and have accomplished the present invention as a result of the study.

Examples of a material for a ceramic substrate used in the present invention include silicon nitride, aluminum nitride, alumina and the like, and among them, aluminum nitride is suitable for a power module. Thickness of a ceramic substrate is preferably from about 0.5 to 0.8 mm, and if the thickness is too large, heat resistance becomes too large, while if the thickness is too small, durability becomes poor.

Surface properties of a ceramic substrate are important, and since minute defects or cavities on the surface give unfavorable influences when a metal circuit, a heat-radiating metal plate or their precursor metal plate are bonded to a ceramic substrate, the ceramic substrate should preferably have a smooth surface. Accordingly, the ceramic substrate is preferably subjected to such a polishing treatment as honing treatment or mechanical processing.

Examples of a material for a metal circuit and a heat-radiating metal plate used in the present invention include a metal bonded product of first metal-second metal (expect for a combination of the same kinds of metals of the first metal and the second metal) and/or a metal bonded product of first metal-third metal-second metal, and the first metal is bonded to a ceramic substrate. Among them, the metal bonded product of first metal-third metal-second metal is preferable, and a metal bonded product of aluminum-nickel-copper is suitable for a power module, and a metal bonded product of aluminum and nickel-coated copper is particularly suitable.

With regard to each thickness of a first metal, a second metal and a third metal, the first metal is preferably from about 30 to 200 $\mu$m, the second metal is preferably from about 100 to 500 $\mu$m and the third metal is preferably from about 5 to 30 $\mu$m. Also, the second metal should preferably have a smaller proof stress, particularly smaller than about 50 MPa.

In a combination of a first metal, a second metal and a third metal, it is preferable that an eutectic point of a first metal and a third metal should be at least about 150° C. higher than an eutectic point of a second metal and a third metal in order to fully achieve its inherent performances of each metal even after forming a metal bonded product. Among them, it is most preferable that the first metal is aluminum and the second metal is nickel-coated copper. The nickel coating can be made by plating, sputtering, vapor deposition and the like, but preferably by plating.

Further, in the present invention, a metal bonded product of the first metal (such as aluminum)-third metal (such as nickel)-second metal (such as copper) is prepared preferably by bonding the first metal to the third metal through an alloy layer (a) containing first metal-third metal-1b Group metal, an alloy layer (b) containing first metal-third metal-4b Group metal and an alloy layer (c) of first metal-third metal, thereby to fully maintain a thermal stress-buffering function of the first metal and to fully utilize a good electroconductivity of the second metal.

These alloy layers are preferably formed in the order of an alloy layer (a), an alloy layer (b) and an alloy layer (c) from the third metal side. With regard to the thickness of each alloy layer, an alloy layer (a) is preferably from about 1 to 5 $\mu$m, an alloy layer (b) is preferably from about 3 to 7 $\mu$m and an alloy layer (c) is preferably from about 4 to 10 $\mu$m.

Kinds of the first metal and the third metal in these alloy layers should preferably be the same metal above mentioned as the first metal and the third metal of a metal bonded product or should preferably contain a metal component common to the first metal and the third metal of a metal bonded product. As a 1b Group metal, copper (Cu), gold (Au), silver (Ag) or an alloy containing at least one of these components is used, but among them, copper is preferable. Also, as a 4b Group metal, silicon (Si), tin (Sn), lead (Pb) or an alloy containing at least one of these components is used, but among them silicon is preferable.

A metal bonded product of first metal-third metal bonded through the above alloy layer (a), alloy layer (b) and alloy layer (c) is novel. This metal bonded product (such as aluminum-nickel bonded product) can be prepared by bringing the first metal into direct contact with the third metal and heat-treating the metals when at least one of the first metal and the third metal contains a 1b Group metal (such as copper) and a 4b Group metal (such as silicon) respectively in an amount of from about 0.1 to 1.2 wt% as an impurity, or by placing a bonding material containing 1b Group metal and/or 4b Group metal between the two metal plates and heat-treating the metals when the first metal plate and the third metal plate do not substantially contain such an impurity or contain only quite a small amount. As the bonding material, a foil or paste containing 1b Group metal and/or 4b Group metal is used.

The heat treatment is carried out preferably under a vacuum condition of about $1 \times 10^{-4}$ Torr, and as a furnace, it is preferable to use an infrared type heating furnace which can make a rapid temperature rise and also can make a minute temperature control. Heating is carried out by raising a temperature to the vicinity of an eutectic point of a first metal (such as aluminum) and a third metal (such as nickel), and the interface between the two metals is slightly melted and is cooled at a speed of at least about 1° C./minute. Concretely, cooling is carried out after maintaining a temperature of about 620 to 630° C. for about 5 to 10 minutes. In this case, a temperature is measured by placing a thermometer into direct contact with a metal surface.

The metal bonded product of first metal-third metal of the present invention is used as a material for forming a metal circuit and/or a heat-radiating metal plate on a substrate. In such a case, it is necessary to have the third metal bonded further to a second metal (such as copper), thus forming a metal bonded product of first metal-third metal-second metal. This can be done by bonding a second metal (such as copper) to a previously prepared metal bonded product (such as Al—Ni bonded product) of first metal-third metal, or by using a second metal (such as copper) coated with a third metal (such as nickel) by electroless plating, sputtering, vapor deposition or the like, as a third metal when preparing a metal bonded product of first metal-third metal. The bonding of a third metal and a second metal can be made not only by plating but also by thermo-compression bonding. This method is employed when bonding a second metal to a previously prepared metal bonded product of first metal-third metal.

The metal bonded product of first metal-third metal of the present invention can be used not only as a material for forming the above metal circuit and/or heat-radiating metal plate but also as a structure material as it is, or can be applied to various uses by bonding to a ceramic substrate.

When preparing a substrate in accordance with the present invention, there is employed a method which comprises forming a metal bonded product of first metal-second metal and/or a metal bonded product of first metal-third metal-second metal so as to bring the first metal into contact with a ceramic substrate and then etching (etching method), or a method which comprises bonding a pattern of metal circuit and/or heat-radiating metal plate prepared by punching the above metal bonded product to a ceramic substrate (pattern-disposing method). In any case, bonding of each metal can be carried out in the same manner as in the preparation of the above metal bonded product of first metal-second metal or metal bonded product of first metal-third metal-second metal. Bonding of a first metal and a ceramic substrate is carried out by active metal-soldering method. The active metal-soldering method is described, for example, in JP-A-60-177634 and U.S. Pat. No. 4,591,537.

When the substrate of the present invention is used for a power module, its optimum embodiment employs an aluminum nitride substrate as a ceramic substrate and a metal bonded product of aluminum-nickel-copper as a metal circuit and/or a heat-radiating metal plate, and aluminum and nickel of the metal bonded product are bonded by intervening an alloy layer (a) of aluminum-nickel-copper, an alloy layer (b) of aluminum-nickel-silicon and an alloy layer (c) of aluminum-nickel therebetween. This substrate can be formed into a metal circuit and/or a heat-radiating metal plate by etching a metal bonded product bonded on an aluminum nitride substrate, thereby producing a highly reliable substrate in mass production. Accordingly, this production method is described in more details hereinafter.

First, an aluminum plate containing a copper component of 1b Group metal and a silicon component of 4b Group metal respectively in an appropriate amount is bonded to an aluminum nitride substrate by active metal-soldering method. The aluminum nitride substrate thus used has a thermal conductivity of at least about 100 W/mK and a bending strength of at least about 350 MPa.

Metal components of a soldering materiel used in the active metal soldering method include preferably aluminum (Al) and silicon (Si) as the main components and an active metal for maintaining wetting property to the aluminum nitride substrate as a secondary component. The active metal component reacts with the aluminum nitride substrate to produce an oxide or a nitride, thereby firmly bonding the soldering material and the aluminum nitride substrate. Examples of the active metal include titanium (Ti), zirconium (Zr), hafnium (Hf), niobium (Nb), tantalum (Ta), vanadium (Va) or a compound thereof. The active metal is contained in an amount of from about 1 to 30 parts by weight per 100 parts by weight of the total amount of aluminum (from about 70 to 95 parts by weight), silicon (from about 30 to 5 parts by weight) and copper (from about 1 to 5 parts by weight). The bonding temperature is preferably from about 600 to 640° C.

Thereafter, a nickel-plated copper plate is bonded to the surface of the aluminum plate. Since the aluminum plate contains an appropriate amount of a copper component of 1b Group metal and a silicon component of 4b Group metal, this bonding can be made by bringing the two plates into direct contact with each other and by heat-treating.

Thereafter, a UV ray-curable type etching resist is printed on the surface of the above obtained aluminum nitride substrate-metal bonded product so as to provide a desired metal circuit pattern and/or heat-radiating metal plate pattern, and etching is carried out with a cupric chloride solution to dissolve and to remove unnecessary parts of copper and nickel of the metal bonded product, and further the etching resist and an unnecessary part of aluminum of the metal bonded product are removed with a sodium hydroxide aqueous solution. The substrate thus obtained still has an unnecessary reaction product of aluminum nitride with the active metal component and the soldering material remained between the metal circuit patterns, and the unnecessary materials are removed with an ammonium fluoride aqueous solution to obtain a desired substrate of the present invention.

EXAMPLES

Hereinafter, the present invention is further illustrated with reference to Examples and Comparative Example.

Examples 1 to 20

(PATTERN-DISPOSING METHOD)

15 parts by weight of terpineol was blended with 100 parts by weight of a soldering material having such a composition as illustrated in the following Table 1, and a toluene solution of polyisobutyl methacrylate was kneaded therewith to prepare a soldering material paste. The soldering material paste thus prepared was screen-printed on the whole surfaces of the both sides of an aluminum nitride substrate (size: 60 mm×36 mm×0.65 mm, bending strength: 400 MPa, thermal conductivity: 135 W/mK) to provide a coated amount (after drying) of 3 mg/cm².

Thereafter, such a first metal pattern (purity: about 99.5%, 56 mm×32 mm×0.3 mm) as shown in Table 1 was disposed in direct contact with the both sides of the aluminum nitride substrate, and was heated at a bonding temperature shown in Table 1 under vacuum of $1 \times 10^{-5}$ Torr or lower, and cooled at a temperature-decreasing speed of 2° C./minute. Thereafter, the second metal only (Example 20) was bonded to the surface of the first metal, or the third metal was bonded with the second metal (Example 1 to 19) in accordance with a method shown in Table 1, and the composite was bonded to the substrate. In this case, an infrared type heating furnace was used as a furnace, and temperature was measured by providing a thermometer in contact with the metal surface.

Example 21

(ETCHING METHOD)

An aluminum foil (purity 99.5%, 60 mm×36 mm×0.1 mm) was disposed in contact with both sides of an aluminum nitride substrate coated with the soldering paste of Example 2, and the resultant composite was heated at 630° C. for 30 minutes under vacuum of at most $1 \times 10^{-5}$ Torr, and was cooled at a temperature-decreasing speed of 2° C./minute. Thereafter, a copper plate of a thickness of 300 μm plated with nickel in a thickness of 10 μm was disposed in direct contact with the aluminum foil surface of the aluminum foil-aluminum nitride substrate bonded product, and was heated at 625° C. for 10 minutes under vacuum of at most $1 \times 10^{-5}$ Torr.

A UV ray-curable type etching resist was screen-printed on the metal plate of the bonded product thus obtained, and was subjected to etching treatment with a cupric chloride solution to dissolve and to remove unnecessary parts of copper and nickel of the metal bonded product comprising aluminum-nickel-copper, and the etching resist and an unnecessary part of the aluminum foil on the metal bonded product were removed by a 5% sodium hydroxide aqueous solution. After this etching treatment, an unnecessary reaction product of aluminum nitride with the active metal component and the soldering material remained between the metal circuit patterns of the substrate were removed by dipping the substrate in a 10% ammonium fluoride aqueous solution at 60° C. for 10 minutes to obtain a desired circuit substrate.

Comparative Example 1

90 parts by weight of silver powder, 10 parts by weight of copper powder, 3 parts by weight of zirconium powder, 3 parts by weight of titanium powder and 15 parts of terpineol were blended, and a toluene solution of polyisobutyl methacrylate was kneaded therewith to prepare a soldering material paste. The soldering material paste thus prepared was screen-printed on both sides of the same aluminum nitride substrate as in Example 1 to obtain a circuit pattern-like coating. The coated amount (after drying) was 9 mg/cm².

Thereafter, a copper circuit pattern of 56 mm×32 mm×0.3 mm was disposed in contact with the metal circuit-forming surface and a heat-radiating copper plate pattern of 56 mm×32 mm×0.15 mm was disposed in contact with the heat-radiating metal plate-forming surface. The composite was then heated at 830° C. for 30 minutes under vacuum of at most $1 \times 10^{-5}$ Torr, and was cooled at a temperature-decreasing speed of 2° C./minute to prepare a circuit substrate having the copper metal circuit and the heat-radiating copper plate. The circuit substrates prepared in Examples 1 to 21 and Comparative Example 1 were subjected to a heat cycle test in air having a cycle of maintaining at −40° C. for 30 minutes and allowing to stand at 25° C. for 10 minutes, and a number of heat cycles repeated until occurrence of peeling of a metal circuit or a heat-radiating metal plate was measured.

Further, a peeling strength between a metal circuit and an aluminum nitride substrate was measured.

Still further, in a metal circuit (metal bonded product of first metal-third metal-second metal), an alloy layer (a), an alloy layer (b) and an alloy layer (c) in the bonding layer between the first metal and the third metal were measured in accordance with EPMA (electron ray microanalyzer).

These measurement results are shown in the following Table 2.

TABLE 1

| | | Bonding condition of first metal and aluminum nitride | | | | | Bonding condition of first metal-aluminum nitride substrate and second metal and third metal | | | |
|---|---|---|---|---|---|---|---|---|---|---|---|
| | | Composition of soldering material (part by weight) | | | | First metal thickness (μm) | Bonding temperature ° C. | Second metal thickness (μm) | Third metal thickness (μm) | Bonding temperature ° C. | Method of bonding second metal and third metal |
| | | Al | Si | Cu | Active metal | | | | | | |
| Ex. | 1 | 86 | 10 | 4 | TiH₂ 20 | Al 100 | 630 | Cu 300 | Ti 20 | 625 | Cladding |
| | 2 | 86 | 10 | 4 | TiH₂ 20 | Al 100 | 630 | Cu 300 | Ni 10 | 625 | Elecroless plating |
| | 3 | 86 | 10 | 4 | TiH₂ 20 | Al 100 | 630 | Cu 300 | Ni 10 | 625 | Cladding |
| | 4 | 86 | 10 | 4 | TiH₂ 20 | Al 50 | 630 | Cu 300 | Ti 20 | 625 | Cladding |

TABLE 1-continued

| | | Bonding condition of first metal and aluminum nitride | | | | | Bonding condition of first metal-aluminum nitride substrate and second metal and third metal | | | | |
|---|---|---|---|---|---|---|---|---|---|---|---|
| | | Composition of soldering material (part by weight) | | | | First metal thickness ($\mu$m) | Bonding temperature ° C. | Second metal thickness ($\mu$m) | Third metal thickness ($\mu$m) | Bonding temperature ° C. | Method of bonding second metal and third metal |
| | | Al | Si | Cu | Active metal | | | | | | |
| Ex. | 5 | 86 | 10 | 4 | TiH$_2$ 20 | Al 100 | 630 | Cu 500 | Ni 10 | 625 | Elecroless plating |
| | 6 | 86 | 10 | 4 | TiH$_2$ 25 | Al 100 | 630 | Cu 300 | Ni 10 | 625 | Cladding |
| | 7 | 86 | 10 | 4 | TiH$_2$ 20 | Al 150 | 630 | Cu 300 | Ni 10 | 625 | Cladding |
| | 8 | 86 | 10 | 4 | TiH$_2$ 20 | Al 100 | 630 | Cu 300 | Ni 20 | 625 | Cladding |
| | 9 | 86 | 10 | 4 | TiH$_2$ 20 | Al 100 | 630 | Cu 300 | Zr 10 | 625 | Cladding |
| | 10 | 86 | 10 | 4 | TiH$_2$ 20 | Al 100 | 630 | Cu 300 | Mo 10 | 625 | Cladding |
| | 11 | 86 | 10 | 4 | TiH$_2$ 20 | Al 100 | 630 | Cu 300 | W 10 | 625 | Cladding |
| | 12 | 93 | 5 | 2 | TiH$_2$ 20 | Al 100 | 640 | Cu 300 | Ni 10 | 625 | Elecroless plating |
| | 13 | 86 | 10 | 4 | TiH$_2$ 20 | Al 100 | 640 | Cu 300 | Ni 10 | 630 | Elecroless plating |
| | 14 | 86 | 10 | 4 | TiH$_2$ 10 | Al 100 | 610 | Cu 300 | Ni 10 | 600 | Elecroless plating |
| | 15 | 86 | 10 | 4 | TiH$_2$ 20 | Pb 100 | 630 | Cu 300 | Ti 20 | 625 | Cladding |
| | 16 | 86 | 10 | 4 | TiH$_2$ 20 | Pb 100 | 630 | Al 300 | Ti 20 | 625 | Cladding |
| | 17 | 86 | 10 | 4 | Zr 20 | Al 100 | 630 | Cu 300 | Ni 10 | 625 | Elecroless plating |
| | 18 | 86 | 10 | 4 | HfH$_2$ 20 | Al 100 | 630 | Cu 300 | Ni 10 | 625 | Elecroless plating |
| | 19 | 86 | 10 | 4 | Nb 20 | Al 100 | 630 | Cu 300 | Ni 10 | 625 | Elecroless plating |
| | 20 | 86 | 10 | 4 | TiH$_2$ 20 | Al 100 | 630 | Cu 300 | — | 540 | — |
| | 21 | 86 | 10 | 4 | TiH$_2$ 20 | Al 100 | 630 | Cu 300 | Ni 10 | 625 | Elecroless plating |
| Com. Ex. | 1 | Method for applying a copper circuit pattern by active metal soldering method using Ag-Cu-Zr-Ti soldering material | | | | | | | | | |

TABLE 2

| | | Alloy layer composition of bonding layer between first metal and third metal of metal circuit | | | | | | Peeling strength Kg/cm | Cycle number of causing peeling of metal |
|---|---|---|---|---|---|---|---|---|---|
| | | Alloy layer (a) | Thickness $\mu$m | Alloy layer (b) | Thickness $\mu$m | Alloy layer (c) | Thickness $\mu$m | | |
| Ex. | 1 | Al-Ti-Cu | 3 | Al-Ti-Si | 5 | Al-Ti | 7 | 15 | 3200 |
| | 2 | Al-Ni-Cu | 3 | Al-Ni-Si | 5 | Al-Ni | 8 | 15 | 3200 |
| | 3 | Al-Ni-Cu | 3 | Al-Ni-Si | 5 | Al-Ni | 8 | 15 | 3200 |
| | 4 | Al-Ti-Cu | 3 | Al-Ti-Si | 5 | Al-Ti | 7 | 17 | 3200 |
| | 5 | Al-Ni-Cu | 3 | Al-Ni-Si | 5 | Al-Ni | 8 | 15 | 2000 |
| | 6 | Al-Ni-Cu | 3 | Al-Ni-Si | 5 | Al-Ni | 8 | 15 | 3200 |
| | 7 | Al-Ni-Cu | 3 | Al-Ni-Si | 5 | Al-Ni | 8 | 16 | 3200 |
| | 8 | Al-Ni-Cu | 3 | Al-Ni-Si | 5 | Al-Ni | 8 | 15 | 3200 |
| | 9 | Al-Zr-Cu | 4 | Al-Zr-Si | 6 | Al-Zr | 7 | 14 | 3200 |
| | 10 | Al-Mo-Cu | 3 | Al-Mo-Si | 6 | Al-Mo | 7 | 14 | 3200 |
| | 11 | Al-W-Cu | 4 | Al-W-Si | 5 | Al-W | 8 | 14 | 3200 |
| Ex. | 12 | Al-Ni-Cu | 1.5 | Al-Ni-Si | 3.5 | Al-Ni | 8 | 15 | 3100 |
| | 13 | Al-Ni-Cu | 4 | Al-Ni-Si | 6 | Al-Ni | 9 | 15 | 3000 |
| | 14 | Al-Ni-Cu | 2 | Al-Ni-Si | 4 | Al-Ni | 5 | 14 | 3000 |
| | 15 | Pb-Ti-Cu | 3 | Pb-Ti-Si | 5 | Pb-Ti | 7 | 15 | 2000 |
| | 16 | Pb-Ti-Cu | 3 | Pb-Ti-Si | 5 | Pb-Ti | 7 | 15 | 2000 |
| | 17 | Al-Ni-Cu | 3 | Al-Ni-Si | 5 | Al-Ni | 8 | 15 | 3000 |
| | 18 | Al-Ni-Cu | 3 | Al-Ni-Si | 5 | Al-Ni | 8 | 15 | 3000 |
| | 19 | Al-Ni-Cu | 3 | Al-Ni-Si | 5 | Al-Ni | 8 | 15 | 3000 |
| | 20 | — | — | — | — | Al-Cu | 8 | 15 | 3000 |
| | 21 | Al-Ni-Cu | 3 | Al-Ni-Si | 5 | Al-Ni | 8 | 15 | 3200 |
| Com. Ex. | 1 | — | | | | | | 13 | 1100 |

With regard to a proof stress of a first metal used in Examples, aluminum (Al) has a proof stress of 11.7 MPa and lead (Pd) has a proof stress of 8.3 MPa. Also, an eutectic point between a first metal and a third metal and an eutectic point between a second metal and a third metal are as follows.

(Eutectic point between first and third metal)
 Al—Cu: 548° C.
 Pb—Cu: 327° C.
 Pb—Al: 327° C.

(Eutectic point between second metal and third metal)
 Cu—Ti: 890° C.
 Cu—Ni: 1083° C.
 Cu—Zr: 880° C.
 Cu—Mo: at least 1000° C.
 Cu—W: at least 1000° C.
 Al—Ti: 660° C.

According to the present invention, a highly reliable substrate (circuit substrate or heat-radiating substrate) excellent in heat cycle resistance is provided. The substrate of the present invention is particularly suitable for a driving part of an electric train, a power module of an electric car, and the like. Further, according to the method for preparing a substrate of the present invention, a highly reliable substrate (circuit substrate or heat-radiating substrate) excellent in heat cycle resistance can be produced in mass production.

Still further, according to the present invention, a metal bonded product having a large peeling strength excellent in heat cycle resistance is provided. This metal bonded product is used not only for providing a highly reliable substrate of metal circuit and/or heat-radiating metal plate but also for a structure material as it is.

What is claimed is:

1. An article comprising a metal circuit and/or a heat-radiating metal plate formed on a ceramic substrate, wherein the metal circuit and/or the heat-radiating metal plate comprise either (1) the following first metal-second metal bonded product, wherein the first metal and the second metal are different, or (2) the following first metal-third metal-second metal bonded product, and wherein in (1) and (2) the first metal is bonded to the ceramic substrate;

first metal: a metal selected from the group consisting of aluminum (Al), lead (Pb), platinum (Pt) and an alloy containing at least one of these metal components, second metal: a metal selected from the group consisting of copper (Cu), silver (Ag), gold (Au), aluminum (Al) and an alloy containing at least one of these metal components, and third metal: a metal selected from the group consisting of titanium (Ti), nickel (Ni), zirconium (Zr), molybdenum (Mo), tungsten (W) and an alloy containing at least one of these metal components.

2. The article according to claim 1, wherein the first metal is aluminum and the third metal and second metal together is nickel-coated copper, respectively.

3. The article according to claim 1, wherein the first metal is bonded to the third metal through an alloy layer (a) containing first metal-third metal-1b Group metal, an alloy layer (b) containing first metal-third metal-4b Group metal and an alloy layer (c) of first metal-third metal.

4. The article according to claim 3, wherein the first metal is aluminum, the second metal is copper and the third metal is nickel.

5. The article-according to claim 3, wherein the 1b Group metal is copper and the 4b Group metal is silicon.

6. The article according to claim 4, wherein the 1b Group metal is copper and the 4b Group metal is silicon.

7. The article according to claim 1, wherein the article is a power module substrate.

8. A method for preparing the article of claim 1, which comprises bonding a first metal circuit pattern and/or a heat-radiating metal plate pattern to a metal circuit-forming surface and/or a heat-radiating metal plate-forming surface of a ceramic substrate by active metal-soldering method, and further bonding a second metal pattern different from the first metal thereto with or without intervening a third metal therebetween.

9. A method for preparing the article of claim 1, which comprises bonding a solid metal plate of a first metal to a metal circuit-forming surface and/or a heat-radiating metal plate-forming surface of a ceramic substrate by active metal-soldering method, further bonding a solid metal plate of a second metal different from the first metal thereto with or without intervening a third metal therebetween, and then etching to form a metal circuit and/or a heat-radiating metal plate.

10. The method according to claim 8, wherein the first metal is aluminum and the third metal and second metal together is nickel-coated copper, respectively.

11. The method according to claim 9, wherein the first metal is aluminum and the third metal and second metal together is nickel-coated copper.

12. The method according to claim 8, wherein the article is a power module substrate.

13. A metal bonded product obtained by bonding the following first metal to the following third metal through an alloy layer (a) containing first metal-third metal-1b Group metal, an alloy layer (b) containing first metal-third metal-4b Group metal and an alloy layer (c) of first metal-third metal;

first metal: a metal selected from the group consisting of aluminum (Al), lead (Pd), platinum (Pt) and an alloy containing at least one of these metal components, and third metal: a metal selected from the group consisting of titanium (Ti), nickel (Ni), Zirconium (Zr), molybdenum (Mo), tungsten (W) and an alloy containing at least one of these metal components.

14. The metal bonded product according to claim 13, wherein the first metal is aluminum and the third metal is nickel.

15. The metal bonded product according to claim 13, wherein the 1b Group metal is copper and the 4b Group metal is silicon.

16. The metal bonded product according to claim 14, wherein the 1b Group metal is copper and the 4b Group metal is silicon.

17. The metal bonded product according to claim 13, wherein the third metal is further bonded to the following second metal;

second metal: a metal selected from the group consisting of copper (Cu), silver (Ag), gold (Au), aluminum (Al) and an alloy containing at least one of these metal components.

18. The metal bonded product according to claim 17, wherein the metal bonded product is used as a metal circuit and/or a heat-radiating metal plate for a power module substrate.

* * * * *

UNITED STATES PATENT AND TRADEMARK OFFICE
CERTIFICATE OF CORRECTION

PATENT NO. : 6,197,435 B1  
DATED : March 6, 2001  
INVENTOR(S) : Yoshihiko Tsujimura, et al.

It is certified that error appears in the above-identified patent and that said Letters Patent is hereby corrected as shown below:

<u>Title page,</u>  
Item (30), the Foreign Application Priority Data is listed incorrectly. Item (30) should read as follows:

-- (30)     Foreign Application Priority Data

Nov. 7, 1997    (JP) ........................................ 9-305634 --

Signed and Sealed this

Twenty-fifth Day of September, 2001

Attest:

NICHOLAS P. GODICI  
*Attesting Officer*     *Acting Director of the United States Patent and Trademark Office*